US012777840B2

(12) United States Patent
Qiu et al.

(10) Patent No.: US 12,777,840 B2
(45) Date of Patent: Oct. 27, 2026

(54) EXCIPLEX BASED ORGANIC ELECTROLUMINESCENT DEVICE, DISPLAY PANEL, AND DISPLAY DEVICE

(71) Applicant: BOE Technology Group Co., Ltd., Beijing (CN)

(72) Inventors: Lixia Qiu, Beijing (CN); Lei Chen, Beijing (CN); Dongxu Zhang, Beijing (CN); Bingyan Liang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 356 days.

(21) Appl. No.: 18/577,245

(22) PCT Filed: Jul. 1, 2022

(86) PCT No.: PCT/CN2022/103408

§ 371 (c)(1),
(2) Date: Jan. 6, 2024

(87) PCT Pub. No.: WO2023/000961

PCT Pub. Date: Jan. 26, 2023

(65) Prior Publication Data

US 2024/0334817 A1 Oct. 3, 2024

(30) Foreign Application Priority Data

Jul. 21, 2021 (CN) ......................... 202110822938.1

(51) Int. Cl.
*H10K 85/60* (2023.01)
*H10K 50/12* (2023.01)
(Continued)

(52) U.S. Cl.
CPC ........... *H10K 85/633* (2023.02); *H10K 50/12* (2023.02); *H10K 50/125* (2023.02);
(Continued)

(58) Field of Classification Search
CPC .... H10K 85/633; H10K 50/12; H10K 50/125; H10K 85/324; H10K 85/342;
(Continued)

(56) References Cited

U.S. PATENT DOCUMENTS

2014/0225100 A1* 8/2014 Yokoyama ........... C07D 333/76 257/40
2023/0009845 A1 1/2023 Lee et al.
2023/0269957 A1 8/2023 Qiu et al.

FOREIGN PATENT DOCUMENTS

CN 110931649 A 3/2020
CN 111969119 A * 11/2020
(Continued)

OTHER PUBLICATIONS

Editor: Li Yang. “2016-2017 Report on Advances In Photoimaging.” Published by China Science and Technology Press. Mar. 2018.
(Continued)

*Primary Examiner* — Duy T Nguyen
(74) *Attorney, Agent, or Firm* — IPro, PLLC

(57) ABSTRACT

An organic electroluminescent device, a display panel, and a display device are disclosed. The organic electroluminescent device includes: an anode and a cathode disposed opposite to each other, a light emitting layer located between the anode and the cathode, an electron blocking layer located between the light emitting layer and the anode, and a hole transport layer located between the electron blocking layer and the anode. The light emitting layer includes an exciplex formed by mixing an electron-type host material and a hole-type host material, and a guest material with which the exciplex is doped. The electron mobility of the hole transport layer is greater than that of the electron blocking layer.

17 Claims, 4 Drawing Sheets

(51) Int. Cl.

| | |
|---|---|
| ***H10K 50/125*** | (2023.01) |
| ***H10K 85/30*** | (2023.01) |
| ***H10K 101/25*** | (2023.01) |
| ***H10K 101/30*** | (2023.01) |
| ***H10K 101/40*** | (2023.01) |
| *H10K 102/00* | (2023.01) |

(52) U.S. Cl.
CPC ......... *H10K 85/324* (2023.02); *H10K 85/342* (2023.02); *H10K 85/346* (2023.02); *H10K 85/371* (2023.02); *H10K 85/623* (2023.02); *H10K 85/636* (2023.02); *H10K 85/6574* (2023.02); *H10K 85/6576* (2023.02); *H10K 2101/25* (2023.02); *H10K 2101/30* (2023.02); *H10K 2101/40* (2023.02); *H10K 2102/351* (2023.02)

(58) Field of Classification Search
CPC .. H10K 85/346; H10K 85/371; H10K 85/623; H10K 85/636; H10K 85/6574; H10K 85/6576; H10K 2101/25; H10K 2101/30; H10K 2101/40; H10K 2102/351; H10K 2101/10; H10K 50/11; H10K 50/18; H10K 50/181; H10K 85/631; H10K 85/654; H10K 85/6572; H10K 50/155; H10K 85/657
USPC ............................................................ 257/40
See application file for complete search history.

(56) References Cited

FOREIGN PATENT DOCUMENTS

| | | | | |
|---|---|---|---|---|
| CN | 113555510 | A | | 10/2021 |
| KR | 20210072883 | A | * | 6/2021 |
| WO | 2021085982 | A1 | | 5/2021 |

OTHER PUBLICATIONS

PCT/CN2022/103408 international search report dated Sep. 8, 2022.
CN202110822938.1 first office action dated Dec. 13, 2022.
CN202110822938.1 second office action dated Mar. 8, 2023.
CN202110822938.1 decision of rejection Jun. 17, 2023.

* cited by examiner

EXCIPLEX BASED ORGANIC ELECTROLUMINESCENT DEVICE, DISPLAY PANEL, AND DISPLAY DEVICE

CROSS-REFERENCE TO RELATED APPLICATIONS

This application is a National Stage of International Application No. PCT/CN2022/103408, filed on Jul. 1, 2022, which claims priority to Chinese Patent Application No. 202110822938.1, filed with the China National Intellectual Property Administration on Jul. 21, 2021 and entitled "Organic Electroluminescent Device, Display Panel and Display Device", which is hereby incorporated by reference in its entirety.

TECHNICAL FIELD

The disclosure relates to the field of display technology, and in particular to an organic electroluminescent device, a display panel and a display device.

BACKGROUND

In recent years, the organic electroluminescent display (OLED), as a new type of flat panel display, has gradually received more attention. Due to characteristics such as active light emission, high luminance, high resolution, wide viewing angle, fast response speed, color saturation, lightness and thinness, low energy consumption and flexibility, the OLED is known as a dream display and has become the hottest mainstream display product in the current market.

SUMMARY

In an aspect, an embodiment of the disclosure provides an organic electroluminescent device, including: an anode and a cathode disposed opposite to each other, a light emitting layer located between the anode and the cathode, an electron blocking layer located between the light emitting layer and the anode, and a hole transport layer located between the electron blocking layer and the anode; where:

- the light emitting layer includes: an exciplex formed by mixing an electron-type host material and a hole-type host material, and a guest material doped in the exciplex;
- an electron mobility of the hole transport layer is greater than an electron mobility of the electron blocking layer, an absolute value of a difference between an HOMO value of the hole transport layer and an HOMO value of the electron blocking layer is greater than or equal to 0.08 eV and less than or equal to 0.3 eV, a triplet energy level of the guest material is less than a triplet energy level of the electron blocking layer, and the triplet energy level of the electron blocking layer is greater than 2.4 eV.

Optionally, in the above organic electroluminescent device according to embodiments of the disclosure, a ratio of the electron mobility of the hole transport layer to the electron mobility of the electron blocking layer is between 1 and $10^4$.

Optionally, in the above organic electroluminescent device according to embodiments of the disclosure, the electron mobility of the hole transport layer is $10^{-5}$ $cm^2/(V\cdot s)$ to $10^{-3}$ $cm^2/(V\cdot s)$, and the electron mobility of the electron blocking layer is $10^{-7}$ $cm^2/(V\cdot s)$ to $10^{-5}$ $scm^2/(V\cdot s)$.

Optionally, in the above organic electroluminescent device according to embodiments of the disclosure, an absolute value of a difference between an LUMO value of the electron blocking layer and an LUMO value of the hole-type host material is greater than 0.3 eV.

Optionally, in the above organic electroluminescent device according to embodiments of the disclosure, an absolute value of a difference between an HOMO value of the hole-type host material and an HOMO value of the electron-type host material is greater than or equal to 0.25 eV and less than or equal to 0.75 eV.

Optionally, in the above organic electroluminescent device according to embodiments of the disclosure, a refractive index of the electron blocking layer is greater than a refractive index of the hole transport layer.

Optionally, in the above organic electroluminescent device according to embodiments of the disclosure, a refractive index of the hole transport layer is 1.7 to 1.8, and a refractive index of the electron blocking layer is 1.8 to 2.0.

Optionally, in the above organic electroluminescent device according to embodiments of the disclosure, a structural general formula of a material of the electron blocking layer is

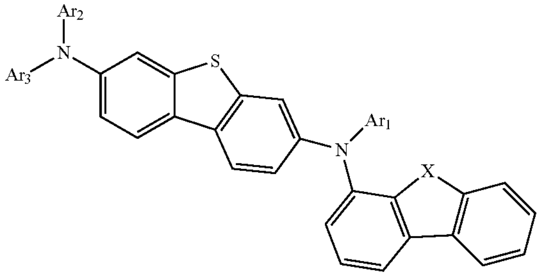
,

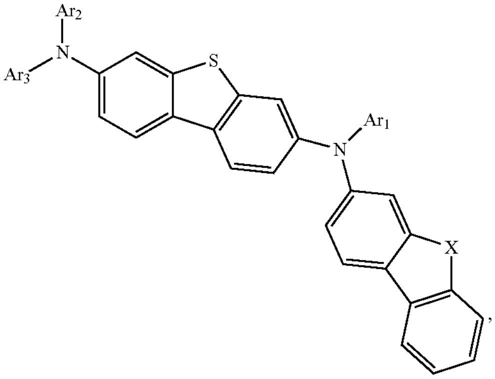
,

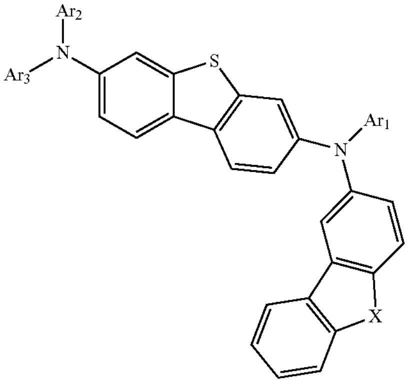
or

-continued

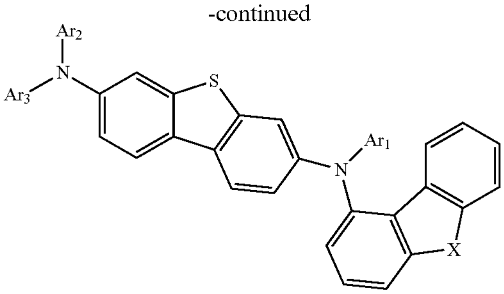

;

where $Ar_1$-$Ar_3$ are C1-C5 alkyl substituted or unsubstituted C6-C30 aryl or heteroaryl group, C3-C10 cycloalkyl substituted or unsubstituted C6-C30 aryl or heteroaryl group; X is O, S, C, Si or N—R; and R is alkyl or cycloalkyl substituted or unsubstituted phenylene, biphenyl or terphenyl.

Optionally, in the above organic electroluminescent device according to embodiments of the disclosure, the material of the electron blocking layer is

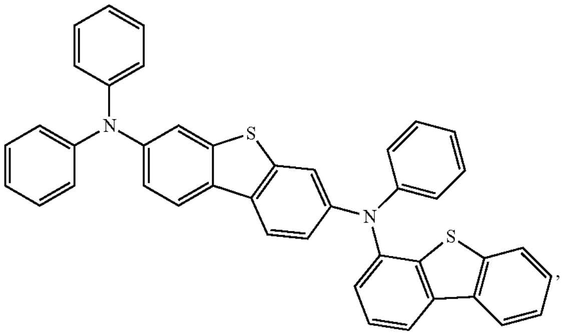

,

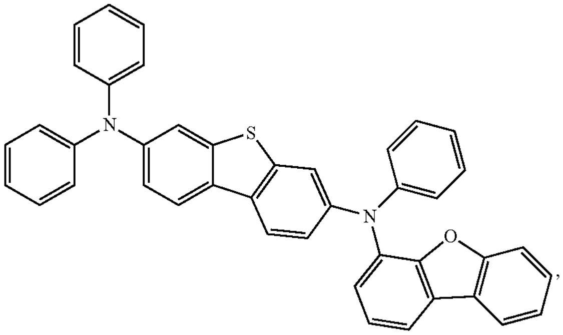

,

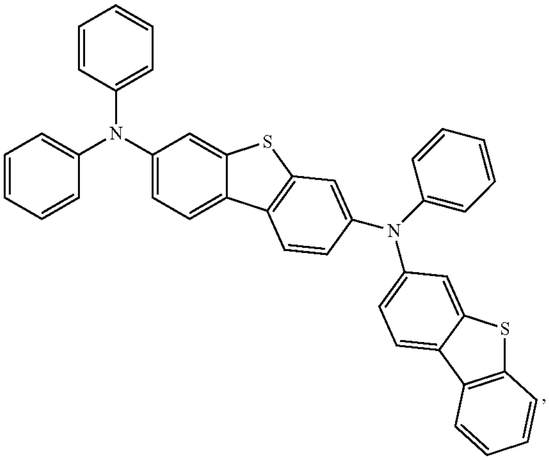

,

-continued

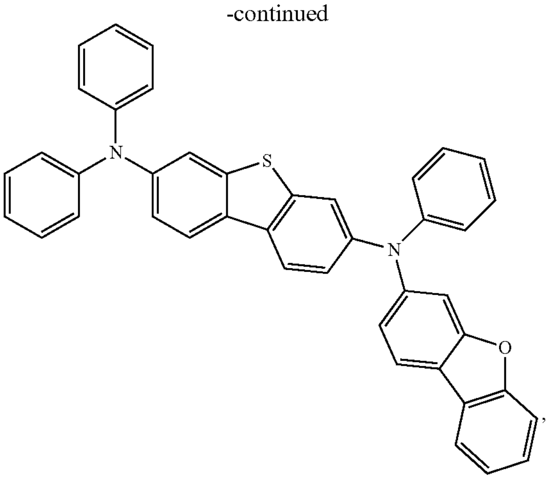

,

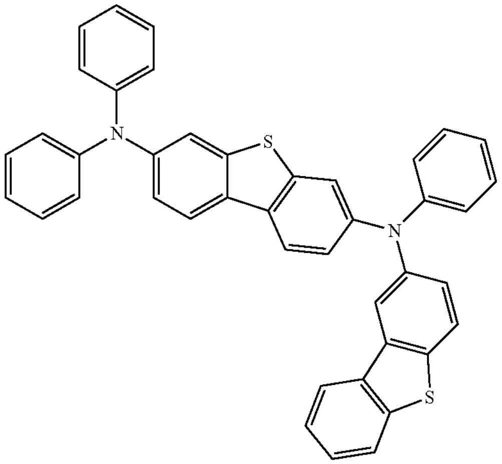

,

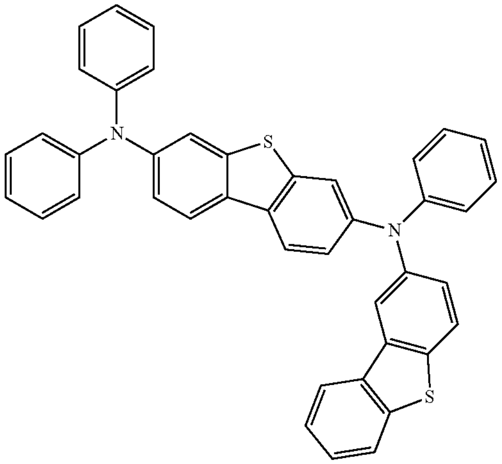

,

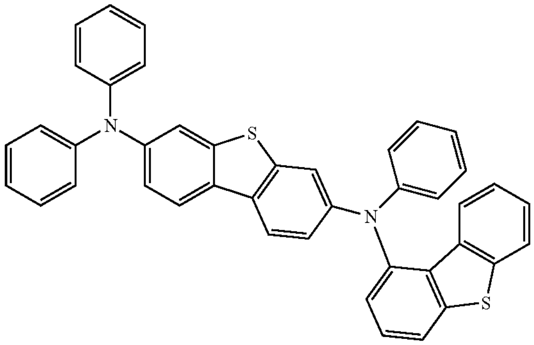

or

-continued

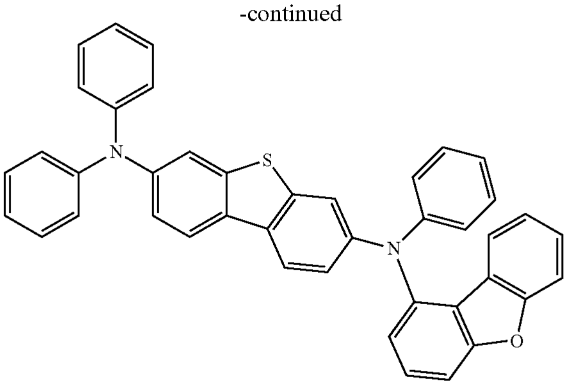

.

Optionally, in the above organic electroluminescent device according to embodiments of the disclosure, a structural general formula of the hole-type host material is

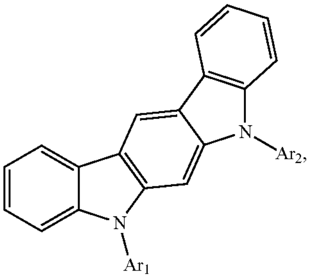

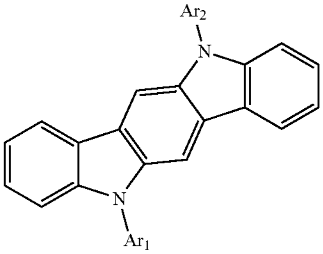

or

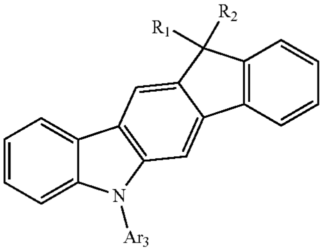

;

where $R_1$ and $R_2$ are alkyl and aryl groups; and $Ar_1$-$Ar_3$ are substituted or unsubstituted aryl or heteroaryl groups.

Optionally, in the above organic electroluminescent device according to embodiments of the disclosure, a structural general formula of the electron-type host material is

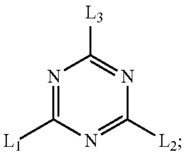

where $L_1$-$L_3$ are substituted or unsubstituted aryl or heteroaryl groups.

Optionally, in the above organic electroluminescent device according to embodiments of the disclosure, the guest material is an organic metal complex, and the metal includes iridium or platinum.

Optionally, in the above organic electroluminescent device according to embodiments of the disclosure, an energy level difference between a triplet energy level of the exciplex and a singlet energy level of the exciplex is less than or equal to 0.1 eV.

Optionally, in the above organic electroluminescent device according to embodiments of the disclosure, an emission spectrum peak of the hole-type host material is less than an emission spectrum peak of the electron-type host material; an emission spectrum peak of the exciplex is greater than or equal to 500 nm and less than or equal to 580 nm.

Optionally, in the above organic electroluminescent device according to embodiments of the disclosure, a thickness of the light emitting layer is 20 nm to 70 nm, and a doping proportion of the guest material in the light emitting layer is 2% to 10%.

Optionally, the above organic electroluminescent device according to embodiments of the disclosure further includes: a hole injection layer located between the anode and the hole transport layer, a hole blocking layer located between the light emitting layer and the cathode, an electron transport layer located between the hole blocking layer and the cathode, and an electron injection layer located between the electron transport layer and the cathode;

where a thickness of the hole injection layer is 5 nm to 20 nm, a thickness of the hole transport layer is 80 nm to 150 nm, a thickness of the hole blocking layer is 5 nm to 20 nm, a thickness of the electron transport layer is 20 nm to 50 nm, and a thickness of the electron injection layer is 1 nm to 10 nm.

Optionally, in the above organic electroluminescent device according to embodiments of the disclosure, the light emitting layer is a red light emitting layer or a green light emitting layer.

In another aspect, an embodiment of the disclosure further provides a display panel, including: a plurality of sub-pixel units, where at least some of the sub-pixel units include the above organic electroluminescent device.

Optionally, in the above display panel according to embodiments of the disclosure, the sub-pixel units include: a red sub-pixel unit, a green sub-pixel unit and a blue sub-pixel unit; where:

the red sub-pixel unit and the green sub-pixel unit include the above organic electroluminescent device, and the blue sub-pixel unit includes a blue organic electroluminescent device;

a light emitting layer of the blue organic electroluminescent device includes an electron-type host material and a blue light guest material;

a thickness of an electron blocking layer of the red sub-pixel unit, a thickness of an electron blocking layer of the green sub-pixel unit, and a thickness of an electron blocking layer of the blue sub-pixel unit decrease in sequence;

hole blocking layers of all the sub-pixel units are a same film layer, and electron transport layers of all the sub-pixel units are a same film layer.

In yet another aspect, an embodiment of the disclosure further provides a display device, including the above display panel.

DETAILED DESCRIPTION

In order to make the purposes, technical solutions and advantages of the disclosure clearer, the technical solutions of embodiments of the disclosure will be described clearly and completely below in combination with the accompanying drawings of embodiments of the disclosure. Obviously the described embodiments are a part of embodiments of the disclosure but not all embodiments. Also in the case of no conflict, embodiments and the features therein in the disclosure can be combined with each other. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The word such as "include" or "contain" or the like used in the disclosure means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect. The words such as "inner", "outer", "up", "down" are only used to represent the relative position relationship. When the absolute position of a described object changes, the relative position relationship may also change accordingly.

It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

With the continuous development of OLED products, the requirements for performance such as efficiency and lifespan of OLED products are getting higher and higher. The performance of a light emitting device mainly depends on the material properties of all film layers and the device matching structure. In terms of material, the material mobility, material stability, material fluorescence quantum yield (PLQY), etc. are mainly considered; and in terms of device matching structure, the energy level matching of adjacent film layers, exciton distribution, electron and hole injection and accumulation, etc. are mainly considered. Regarding the problem of low device efficiency and lifetime, the current main problem is the poor stability of the material of the light emitting layer (EML) and the bias of the recombination region in the electron blocking layer (EBL)/light emitting layer (EML).

Figure 1:
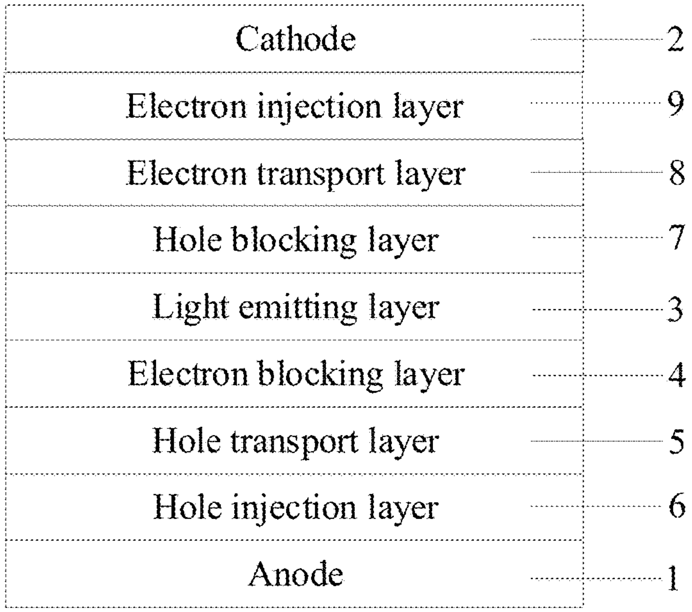
FIG. 1 is a schematic structural diagram of an organic electroluminescent device according to an embodiment of the disclosure.
Figure 2:
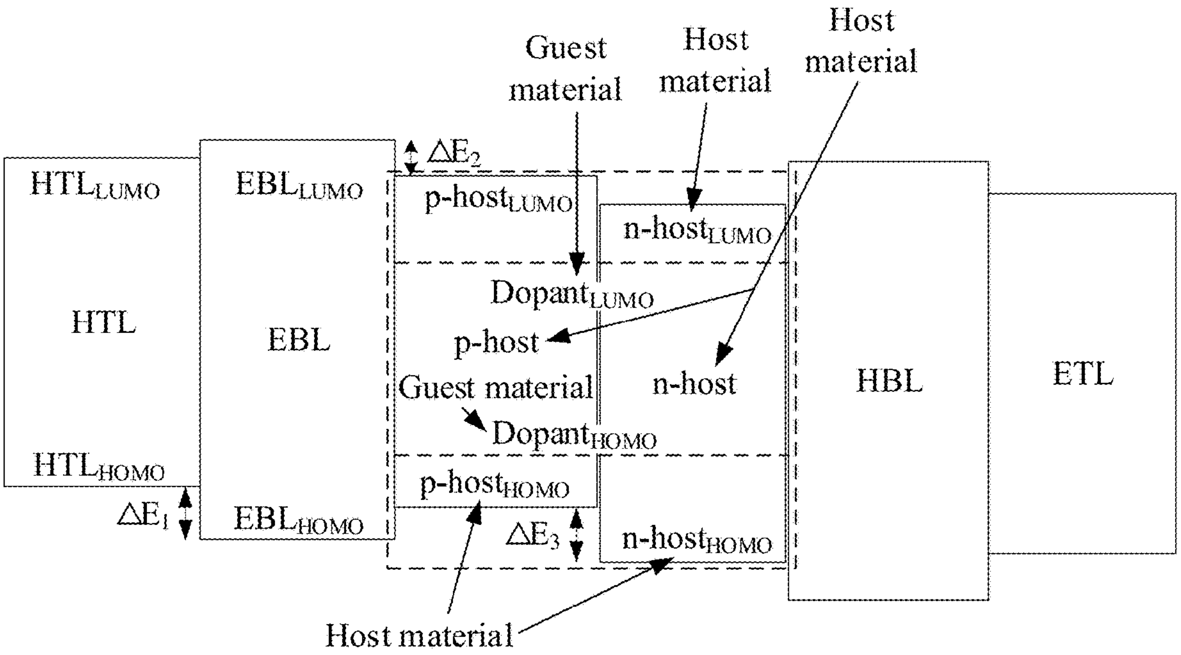
FIG. 2 is a schematic diagram of an energy level relationship of the organic electroluminescent device according to an embodiment of the disclosure.

In view of the above problems existing in the related art, an embodiment of the disclosure provides an organic electroluminescent device, as shown in FIGS. 1 and 2, including: an anode 1 and a cathode 2 disposed opposite to each other, a light emitting layer 3 located between the anode 1 and the cathode 2, an electron blocking layer 4 located between the light emitting layer 3 and the anode 1, and a hole transport layer 5 located between the electron blocking layer 4 and the anode 1.

Here, the light emitting layer 3 includes: an exciplex formed by mixing an electron host material n-host and a hole host material p-host, and a guest material dopant doped in the exciplex.

It should be noted that the electron-type host material n-host refers to a material of which the electron mobility is greater than the hole mobility; and the hole-type host material p-host refers to a material of which the hole mobility is greater than the electron mobility.

An electron mobility of the hole transport layer 5 is greater than an electron mobility of the electron blocking layer 4, an absolute value of a difference between an Highest Occupied Molecular Orbital (HOMO) value of the hole transport layer 5 and an HOMO value of the electron blocking layer 4 is greater than or equal to 0.08 eV and less than or equal to 0.3 eV, a triplet energy level of the guest material dopant is less than a triplet energy level of the electron blocking layer 4, and the triplet energy level of the electron blocking layer 4 is greater than 2.4 eV.

In the above organic electroluminescent device according to embodiments of the disclosure, on the one hand, the energy level barrier between the hole transport layer 5 and the electron blocking layer 4 is increased by setting the electron mobility of the hole transport layer 5 to be greater than the electron mobility of the electron blocking layer 4, avoiding excessive holes from being transported to the electron blocking layer 4 too quickly, solving the problem of accumulation of holes in the electron blocking layer 4/the light emitting layer 3, and alleviating the situation that the recombination region is close to the side of the electron blocking layer 4; and on the other hand, the absolute value $\Delta E_1$ of the difference between the HOMO value of the hole transport layer 5 ($HTL_{HOMO}$) and the HOMO value of the electron blocking layer 4 ($EBL_{HOMO}$) is set to be greater than or equal to 0.08 eV and less than or equal to 0.3 eV, the triplet energy level $T1_{dopant}$ of the guest material dopant is set to be less than the triplet energy level $T1_{EBL}$ of the electron blocking layer 4, and the triplet energy level $T1_{EBL}$ of the electron blocking layer 4 is set to be greater than 2.4 eV. This energy level relationship not only helps to control the injection rate of holes from the hole transport layer 5 to the electron blocking layer 4, but also facilitates the transport of holes on the hole-type host material p-host, so that the holes are effectively limited in the light emitting layer 3 and recombined with electrons to form excitons to emit light, and the exciton recombination region moves toward the center of the light emitting layer 3. The combined effect of the two aspects effectively avoids the accumulation of holes at interfaces of the light emitting layer 3 and the electron blocking layer 4, and enables the holes to better move into the interior of the light emitting layer 3, improving the efficiency and lifetime of the organic electroluminescent device.

Moreover, the above organic electroluminescent device according to embodiments of the disclosure can slightly increase the voltage that drives sub-pixels to emit light, matching the voltage requirement of each sub-pixel in the panel, preventing the low-grayscale panel from reddening, and achieving the technical effect of high efficiency and long lifetime.

Optionally, in the above organic electroluminescent device according to embodiments of the disclosure, in order to effectively control the transmission rate of holes, a ratio of the electron mobility of the hole transport layer to the electron mobility of the electron blocking layer may be set to 1 to $10^4$. For example, the ratio is 1, 10, 100, 1000, 10000, etc.

Optionally, in the above organic electroluminescent device according to embodiments of the disclosure, the electron mobility of the hole transport layer is $10^{-5}$ $scm^2/(V \cdot s)$ to $10^{-3}$ $cm^2/(V \cdot s)$, such as $10^{-5}$ $scm^2/(V \cdot s)$, $10^{-4}$ $cm^2/(V \cdot s)$, $10^{-3}$ $cm^2/(V \cdot s)$, etc.; and the electron mobility of the electron blocking layer is $10^{-7}$ $cm^2/(V \cdot s)$ to $10^{-5}$ $cm^2/(V \cdot s)$, such as $10^{-7}$ $cm^2/(V \cdot s)$, $10^{-6}$ $cm^2/(V \cdot s)$, $10^{-5}$ cm $2/(V \cdot s)$, etc.

Optionally, in the above organic electroluminescent device according to embodiments of the disclosure, as shown in FIG. 2, an absolute value $\Delta E_2$ of a difference between an Lowest Unoccupied Molecular Orbital (LUMO) value of the electron blocking layer 4 ($EBL_{LUMO}$) and an LUMO value of the hole-type host material p-host (p-$host_{LUMO}$) is greater than 0.3 eV, effectively blocking electrons and making holes-electrons emit light more effectively in the light emitting layer 3.

Optionally, in the above organic electroluminescent device according to embodiments of the disclosure, as shown in FIG. 2, an absolute value $\Delta E_3$ of a difference between an HOMO value of the hole-type host material p-host (p-$host_{HOMO}$) and an HOMO value of the electron-type host material n-host (n-$host_{HOMO}$) is greater than or equal to 0.25 eV and less than or equal to 0.75 eV, facilitating formation of the exciplex. The dual-host material is conducive to charge balance and moves the exciton recombination region toward the center of the light emitting layer. The final effect is to make the hole-electron pairs be recombined and emit light more effectively in the light emitting layer, and the exciton recombination region moves toward the center of the light emitting layer, improving the efficiency and lifetime of the device.

Figure 3A:
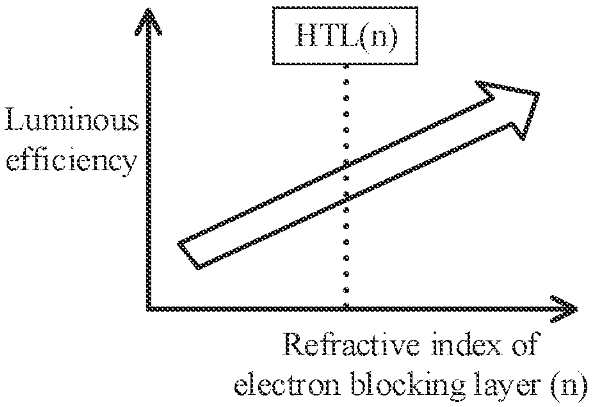
FIG. 3A is a luminous efficiency diagram of the organic electroluminescent device according to an embodiment of the disclosure.
Figure 3B:
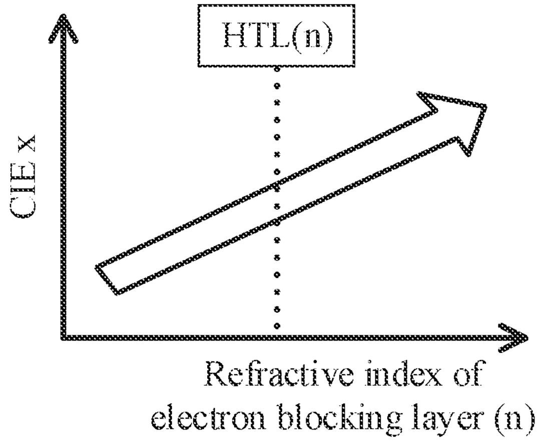
FIG. 3B is a color saturation diagram of the organic electroluminescent device according to an embodiment of the disclosure.

Optionally, in the above organic electroluminescent device according to embodiments of the disclosure, as shown in FIG. 1, a refractive index of the electron blocking layer 4 is greater than a refractive index of the hole transport layer 5. After verification by simulation, as shown in FIG. 3A and FIG. 3B, the refractive index of the electron blocking layer 4 is greater than the refractive index of the hole transport layer 5, to facilitate improving the luminous efficiency and color saturation CIEx (for example, achieving deep red luminescence).

Optionally, in the above organic electroluminescent device according to embodiments of the disclosure, as shown in FIG. 1, the refractive index of the hole transport layer 5 is 1.7 to 1.8, and the refractive index of the electron blocking layer 4 is 1.8 to 2.0. The refractive index of the electron blocking layer 4 is greater than the refractive index of the hole transport layer 5. The electron blocking layer corresponding to the red light emitting device can also be set to be thicker than the electron blocking layers corresponding to the light emitting devices in other colors, to facilitate enhancing the microcavity effect and improving the luminous efficiency.

Optionally, in the above organic electroluminescent device according to embodiments of the disclosure, a material of the electron blocking layer may include dibenzothiophene (DBT), for example, a structural general formula of the material of the electron blocking layer may be but not limited to

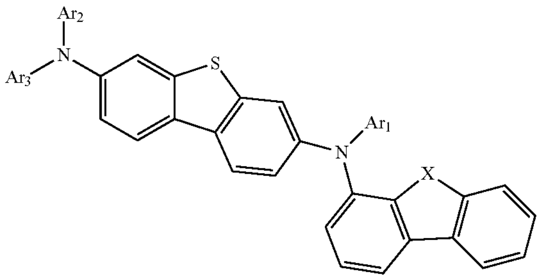
,
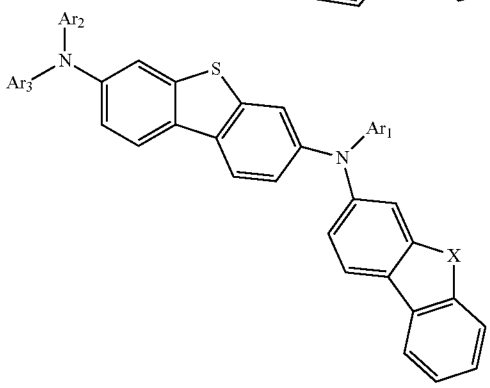
,
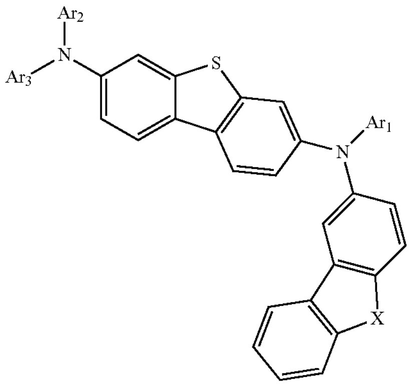
or
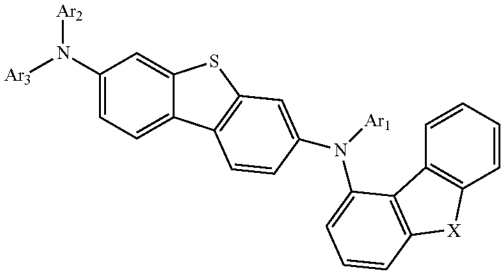
.

Here, $Ar_1$-$Ar_3$ are C1-C5 alkyl substituted or unsubstituted C6-C30 aryl or heteroaryl group, C3-C10 cycloalkyl substituted or unsubstituted C6-C30 aryl or heteroaryl group; X is O, S, C, Si or N—R; and R is alkyl or cycloalkyl substituted or unsubstituted phenylene, biphenyl or terphenyl.
Optionally, in the above organic electroluminescent device according to embodiments of the disclosure, the material of the electron blocking layer may be
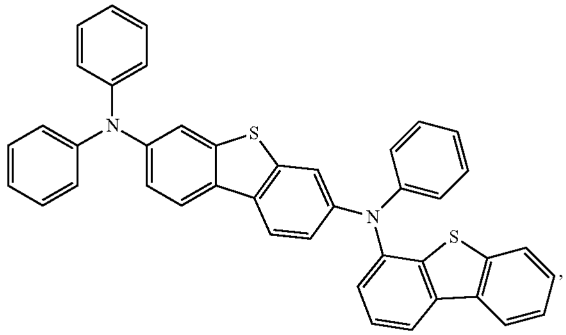
,
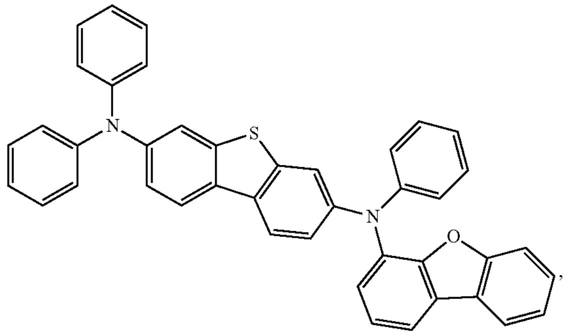
,
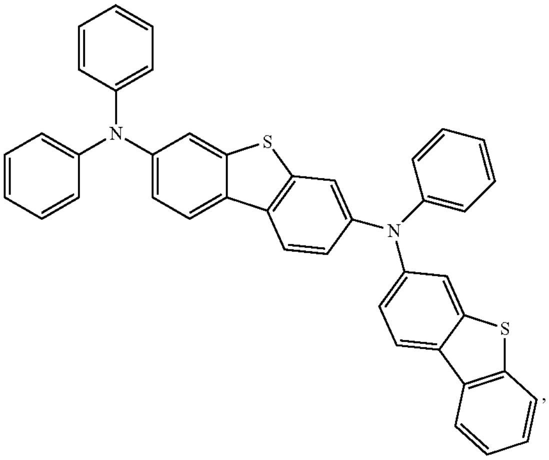
,
-continued
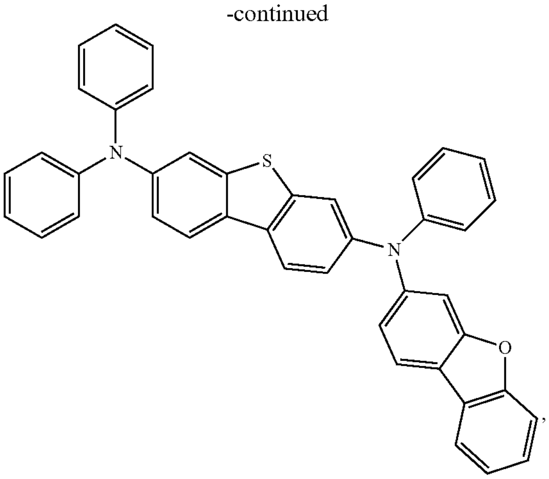
,
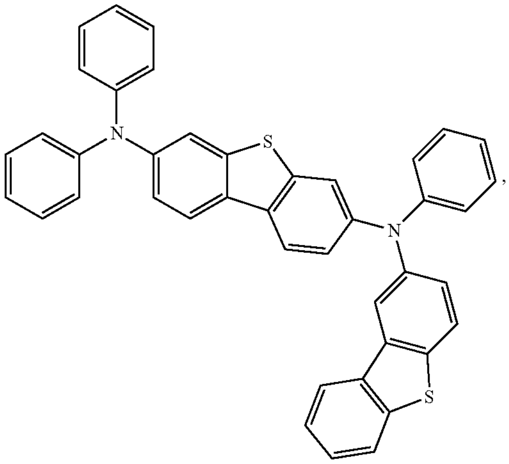
,
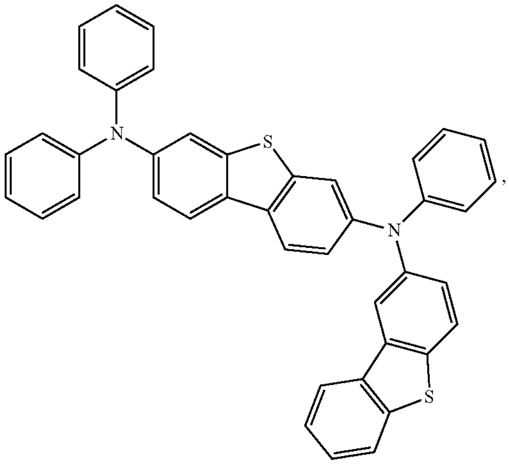
,
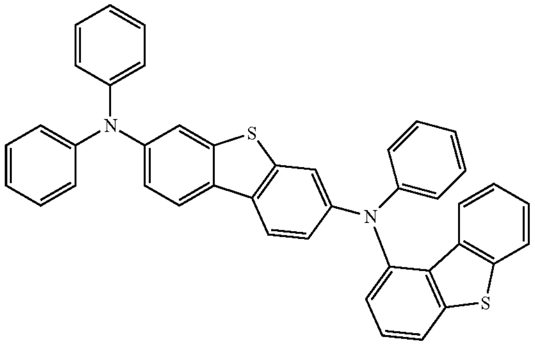
or -continued

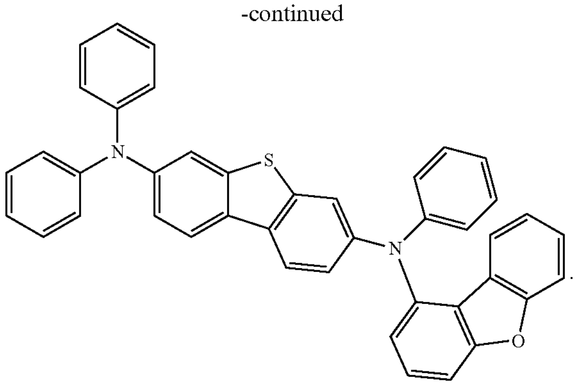

Figure 4:
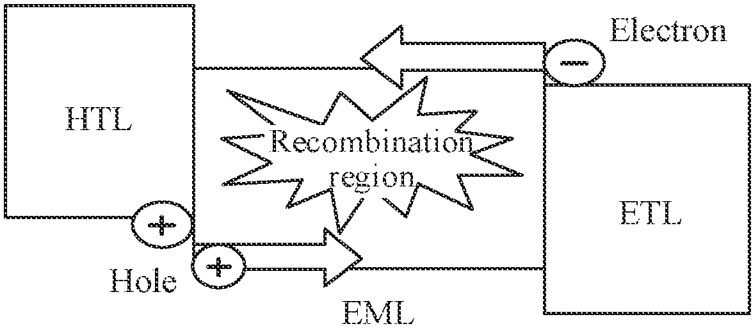
FIG. 4 is a luminescence composite effect diagram of the organic electroluminescent device according to an embodiment of the disclosure.

Optionally, in the above organic electroluminescent device according to embodiments of the disclosure, the disclosure adopts a dual-host material system to facilitate charge balance and move the exciton recombination region toward the center of the light emitting layer. As shown in FIG. 4, compared with the single-component material of the light emitting layer, the p-host is close to the hole transport layer, and the n-host is close to the electron transport layer. The hole-type host material P-host may include an indolocarbazole group or an indenocarbazole group, facilitating hole transport. The structural general formula of the hole-type host material P-host may be

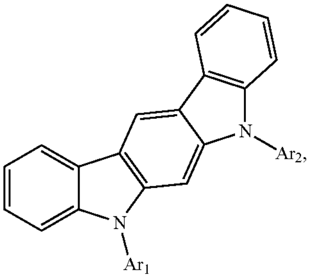

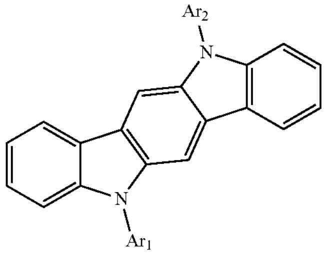

or

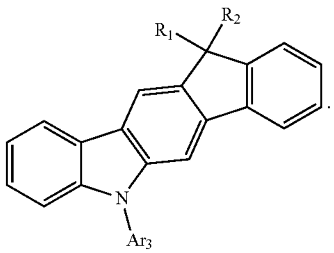

Here, $R_1$ and $R_2$ are alkyl and aryl groups; and $Ar_1$-$Ar_3$ are substituted or unsubstituted aryl or heteroaryl groups.

The electronic host material n-host may include a triazine group, facilitating electron transport. The structural general formula of the electronic host material n-host may be

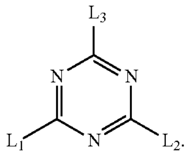

Here, $L_1$-$L_3$ are substituted or unsubstituted aryl or heteroaryl groups.

Optionally, in the above organic electroluminescent device according to embodiments of the disclosure, the exciplex formed by mixing the electron-type host material n-host and the hole-type host material p-host has a longer wavelength spectrum than each of the hole-type host material (p-host) and the electron-type host material (n-host), facilitating the effective transfer of energy to the guest material dopant; and the guest material dopant may be an organic metal complex, and for example, the metal includes iridium or platinum, such as Ir(ppy)2(acac), Ir(ppy)3, etc.

Optionally, in the above organic electroluminescent device according to embodiments of the disclosure, an energy level difference ΔEST between a triplet energy level $T1_{exciplex}$ of the exciplex and a singlet energy level $S1_{exciplex}$ of the exciplex is less than or equal to 0.1 eV, that is, the exciplex has Thermal Activation Delay Feature (TADF) and high luminous efficiency.

Optionally, an emission spectrum peak (PL peak) of the exciplex is greater than or equal to 500 nm and less than or equal to 580 nm.

Figure 5:
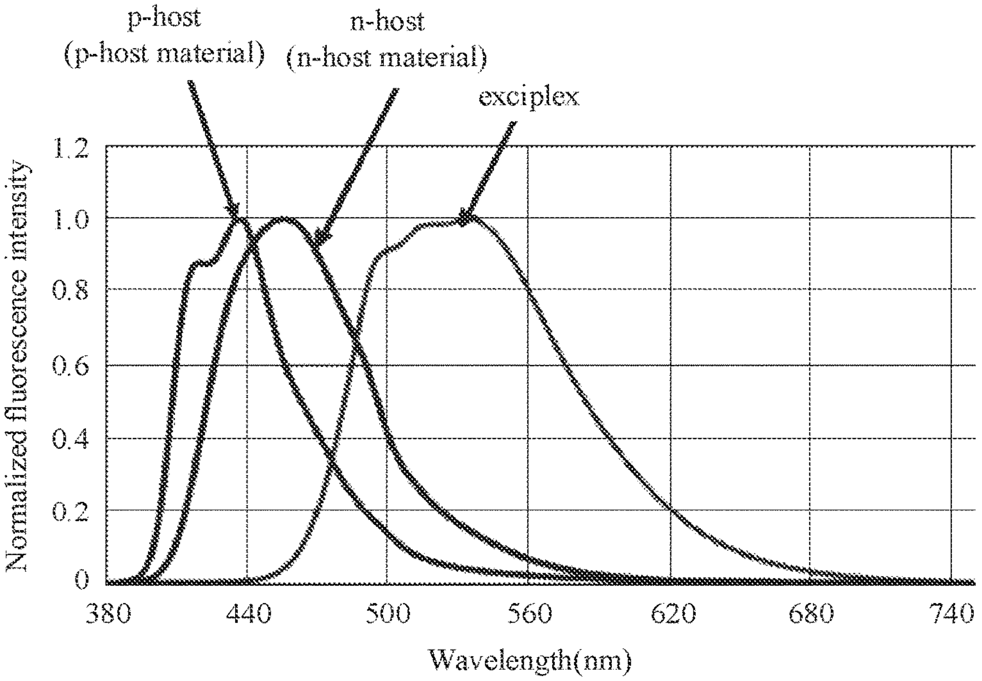
FIG. 5 is an emission spectrum diagram of the organic electroluminescent device according to an embodiment of the disclosure.

Optionally, in the above organic electroluminescent device according to embodiments of the disclosure, as shown in FIG. 5, an emission spectrum peak (PL peak) of the hole-type host material p-host is less than an emission spectrum peak (PL peak) of the electron-type host material n-host. For example, the emission spectrum peak (PL peak) of the hole-type host material p-host is greater than or equal to 350 nm and less than or equal to 490 nm, and the emission spectrum peak (PL peak) of the electron-type host material n-host is greater than or equal to 350 nm and less than or equal to 490 nm.

The emission spectrum peak (PL peak) of the exciplex is greater than or equal to 500 nm and less than or equal to 580 nm.

In related technologies, the host material of the red light emitting layer (R_EML) uses an electron-hole type single host system, and the efficiency of this system can no longer meet the current mass production requirement. The light emitting device according to the disclosure can have higher efficiency and lifetime. Also, it can be seen from the above emission spectrum that the disclosure is applicable to the red phosphorescent system and green phosphorescent system. That is, the light emitting layer in the disclosure may be a red light emitting layer or a green light emitting layer. In addition, when the green organic electroluminescent device and the red organic electroluminescent device adopt the device structure according to the disclosure, the overall performance of the panel can be better improved.

Optionally, in the above organic electroluminescent device according to embodiments of the disclosure, a thickness of the light emitting layer is 20 nm to 70 nm, and a doping proportion of the guest material in the light emitting layer is 2% to 10%, such as 2%, 3%, 4%, 5%, 6%, 7%, 8%, 9%, 10%, etc. On the one hand, this doping proportion enables the host materials (including the hole-type host material p-host and the electron-type host material n-host) to effectively transfer the exciton energy to the guest material dopant, to excite the guest material to emit light; and on the other hand, the host materials (including the hole-type host material p-host and the electron-type host material n-host) “dilute” the guest material, effectively improving the fluorescence quenching caused by the collision between molecules of the guest material and the collision between energies, improving the luminous efficiency and device lifetime.

Optionally, the above organic electroluminescent device according to embodiments of the disclosure, as shown in FIG. 1, may generally further include: a hole injection layer 6 located between the anode 1 and the hole transport layer 5, a hole blocking layer 7 located between the light emitting layer 3 and the cathode 2, an electron transport layer 8 located between the hole blocking layer 7 and the cathode 2, and an electron injection layer 9 located between the cathode 2 and the electron transport layer 8.

Optionally, in the above organic electroluminescent device according to embodiments of the disclosure, a thickness of the hole injection layer may be 5 nm to 20 nm, a thickness of the hole transport layer may be 80 nm to 150 nm, a thickness of the hole blocking layer may be 5 nm to 20 nm, a thickness of the electron transport layer may be 20 nm to 50 nm, and a thickness of the electron injection layer may be 1 nm to 10 nm.

Optionally, in the above organic electroluminescent device according to embodiments of the disclosure, the material of the hole blocking layer may be a triazine compound or BAlq or the like. Optionally, the hole-type host material p-host may be TCP, CBP, mCP, or the like. Optionally, the electronic host material n-host may be a nitrogen-containing heterocyclic compound or a cyano-containing aromatic heterocyclic compound or the like. Optionally, the hole transport layer may be an aromatic amine compound such as NPB, TPD, etc. Optionally, the hole injection layer may be a single-component film layer such as HATCN, CuPc, $MoO_3$, etc.; or may be a doped film layer such as an axene or quinone compound doped with an aromatic amine compound, such as F4TCNQ doped with NPB or TPD.

The electron transport layer may be a mixture of an electron transport material such as nitrogen-containing heterocyclic compound (such as Bphen, TPBi) and lithium quinolate (LiQ). For example, the structural formulas of Bphen, TPBi, LiQ, BAlq, TCP, CBP, mCP, Ir(ppy)3, Ir(ppy)2(acac), NPB, TPD, HATCN, CuPc and F4TCNQ, DCzDCN and PO-T2T are as follows:

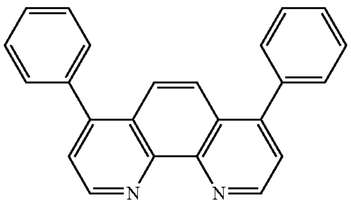

Bphen

-continued

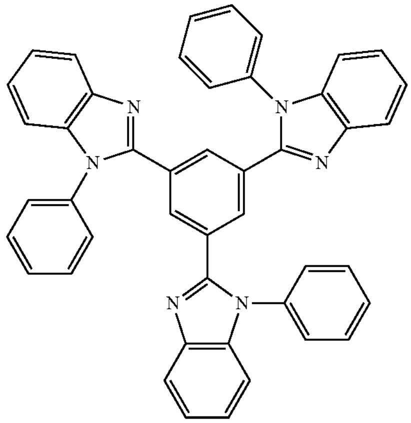

TPBi

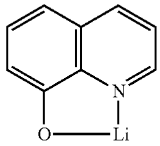

LiQ

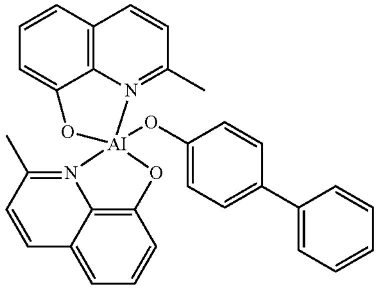

BAlq

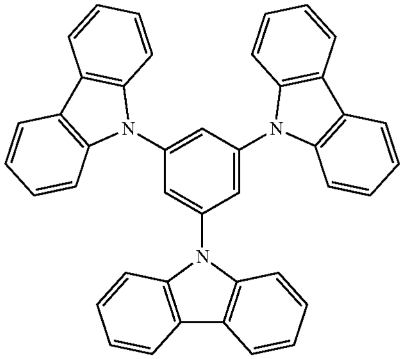

TCP

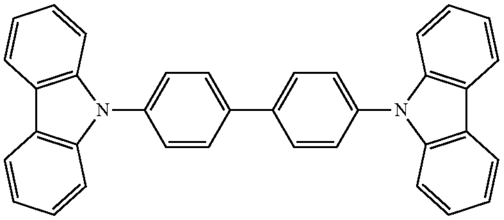

CBP

-continued

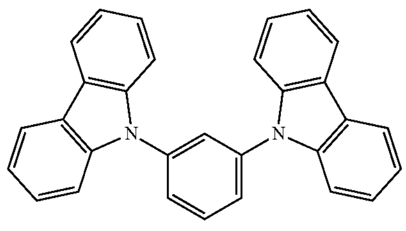

mCP

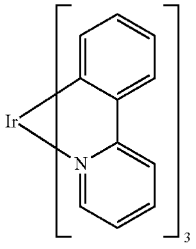

Ir(ppy)$_3$

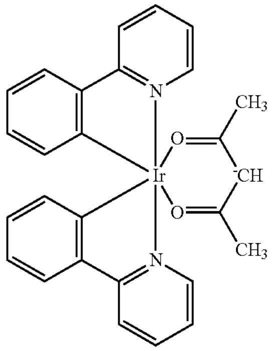

Ir(ppy)$_2$(acac)

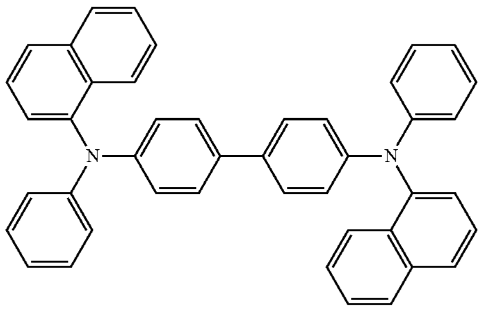 [SMILES: c1ccc(N(c2ccc(-c3ccc(N(c4ccccc4)c4cccc5ccccc45)cc3)cc2)c2cccc3ccccc23)cc1]

NPB

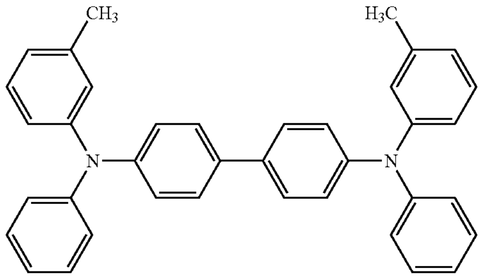

TPD

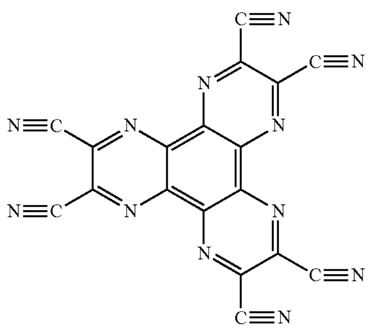

ATCN

-continued

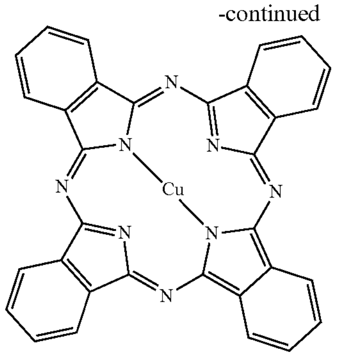

CuPc

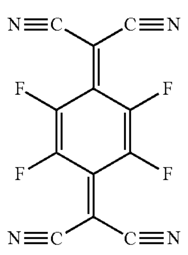

F4TCNQ

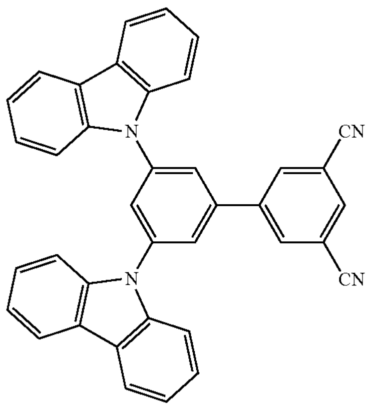

DCzDCN

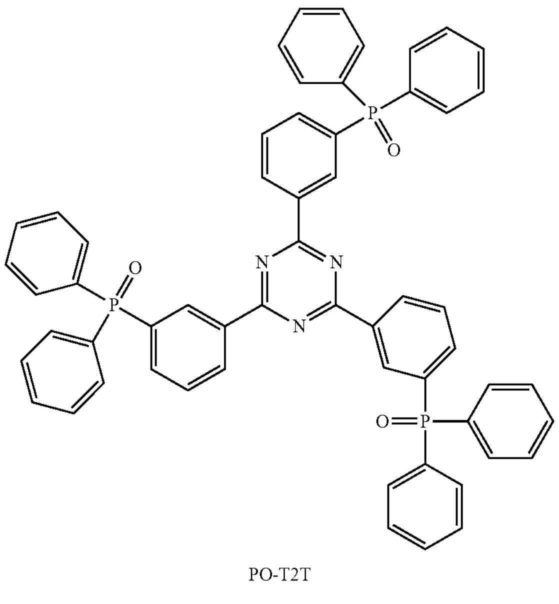

PO-T2T

It should be noted that the light-emitting type of the organic electroluminescent device may be a top-emitting structure or a bottom-emitting structure. The difference between the two structures is whether the light emitting direction of the device is emitting through the substrate or away from the substrate. For the bottom-emitting structure, the light emitting direction of the device is emitting through the substrate; for the top-emitting structure, the light emitting direction of the device is emitting away from the substrate.

It should be noted that the structure of the organic electroluminescent device may be an upright structure or an inverted structure. The difference between the two structures lies in different fabrication orders of film layers. In the upright structure, a cathode, an electron injection layer, an electron transport layer, a hole blocking layer, a light emitting layer, an electron blocking layer, a hole transport layer and an anode are sequentially formed on a substrate; and in the inverted structure, an anode, a hole transport layer, an electron blocking layer, a light emitting layer, a hole blocking layer, an electron transport layer, an electron injection layer and a cathode are sequentially formed on a substrate.

The organic electroluminescent device according to embodiments of the disclosure may have an upright bottom-emitting structure, an upright top-emitting structure, an inverted top-emitting structure, or an inverted bottom-emitting structure, which is not limited.

Furthermore, the lifetime and efficiency of the device of the disclosure will be described below by taking the fabrication of a red organic electroluminescent device as an example. An upright red organic electroluminescent device may be fabricated using the following method.

Figure 6:
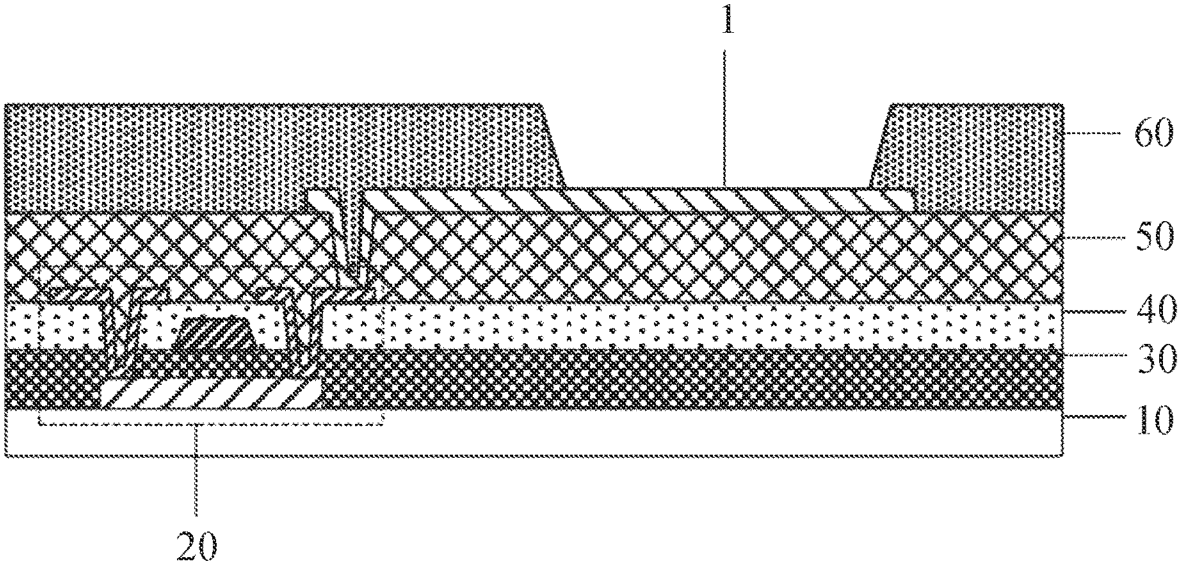
FIG. 6 is a schematic structural diagram of an organic electroluminescent device according to an embodiment of the disclosure.

(1) Forming a pixel driving circuit and an anode 1 electrically connected to the pixel driving circuit on a substrate 10, as shown in FIG. 6; the pixel driving circuit includes a plurality of transistors and at least one storage capacitor. FIG. 6 shows a driving transistor 20 electrically connected to the anode 1. Generally, as shown in FIG. 6, a gate insulating layer 30, an interlayer dielectric layer 40, a planarization layer 50 and a pixel defining layer 60 may also be included.

(2) Using a metal mask (Open mask) to sequentially evaporate to form a hole injection layer with a thickness of 5 nm to 20 nm and a hole transport layer with a thickness of 80 nm to 120 nm on the layer where the anode 1 is located.

(3) Using a Fine Metal Mask (FMM) to sequentially evaporate an electron blocking layer with a thickness of 20 nm to 100 nm and a red light emitting layer 3 with a thickness of 20 nm to 70 nm on the hole transport layer, where the doping mass ratio of the guest material that emits the red light in the light emitting layer is 2% to 10%, and the mass ratio of the hole-type host material p-host to the electron-type host material n-host may be 1:99 to 99:1.

(4) Using the metal mask (Open mask) to sequentially evaporate to form a hole blocking layer with a thickness of 5 nm to 20 nm and an electron transport layer with a thickness of 20 nm to 50 nm on the light emitting layer 3.

(5) Using the metal mask (Open mask) to evaporate an electron injection layer on the electron transport layer, and then evaporate to form a cathode made of metal material on the electron injection layer.

One comparative example and two embodiments are produced using the above-mentioned fabricating method in the disclosure, where the hole injection layer HTL, the hole transport layer HTL, the hole blocking layer HBL, the electron transport layer ETL, the electron injection layer EIL and the cathode are made of the same materials in the comparative example and embodiments. The electron transport layer ETL includes an electron transport material and lithium quinolate with a mass ratio of 5:5; and the difference lies in the electron blocking layer EBL and the light emitting layer EML.

Here, the materials of some film layers are as shown in Table 1 below.

TABLE 1

| | |
|---|---|
| Hole Transport Layer (HTL) | 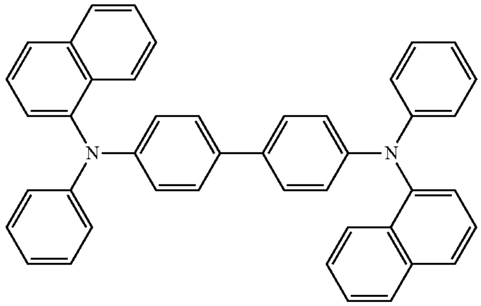 |
| Red light host material RH (single) | 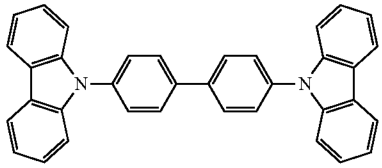 [SMILES: c1ccc2c(c1)c1ccccc1n2-c1ccc(-c2ccc(-n3c4ccccc4c4ccccc43)cc2)cc1] |
| Electron Blocking Layer Material-Comparative Example (EBL-Ref) | 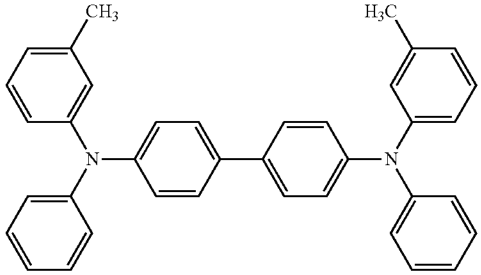 [SMILES: Cc1cccc(N(c2ccccc2)c2ccc(-c3ccc(N(c4ccccc4)c4cccc(C)c4)cc3)cc2)c1] |
| P-host | 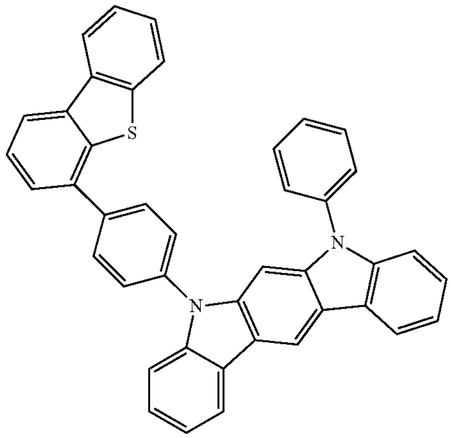 [SMILES: c1ccc(-n2c3ccccc3c3cc4c5ccccc5n(-c5ccc(-c6cccc7c6sc6ccccc67)cc5)c4cc32)cc1] |

TABLE 1-continued

EBL

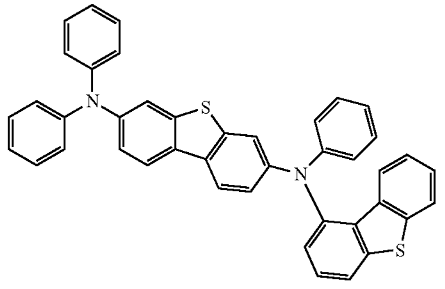 [SMILES: c1ccc(N(c2ccccc2)c2ccc3c(c2)sc2cc(N(c4ccccc4)c4cccc5sc6ccccc6c45)ccc23)cc1]

N-host

Detailed parameters are shown in Table 2.

TABLE 2

| | HIL | HTL | EBL | EML | HBL | ETL | Cathode |
|---|---|---|---|---|---|---|---|
| Comparative Example 1 | 20 nm | 100 nm | EBL- | RH(single):RD | 10 nm | ET:LiQ | 12 nm |
| Embodiment 1 | | | Ref | P + N RH:RD | | (5:5) | |
| Embodiment 2 | | | EBL | P + N RH:RD | | | |

Here, P+N RH:RD means that the light emitting layer according to embodiments of the disclosure includes a hole-type host material, an electron-type host material and a guest material.

The device performance data of the above comparative example and Embodiments 1 to 2 are shown in Table 3.

TABLE 3

| | Voltage | Efficiency | Lifetime | CIEx | CIEy |
|---|---|---|---|---|---|
| Comparative Example 1 | 100% | 100% | 100% | 0.675 | 0.29 |
| Embodiment 1 | 98% | 110% | 103% | 0.682 | 0.31 |
| Embodiment 2 | 102% | 120% | 108% | 0.69 | 0.31 |

As can be seen from Table 3, the efficiency, lifetime and color saturation of devices in Embodiments 1 to 2 according to the disclosure are greatly improved.

Based on the same inventive concept, an embodiment of the disclosure further provides a display panel, including: a plurality of sub-pixel units, where at least some of the sub-pixel units include the above organic electroluminescent device. Since the principle of the display panel to solve the problem is similar to the principle of the above organic electroluminescent device to solve the problem, implementations of the display panel can refer to embodiments of the above organic electroluminescent device, and the repeated description thereof will be omitted.

Figure 7:
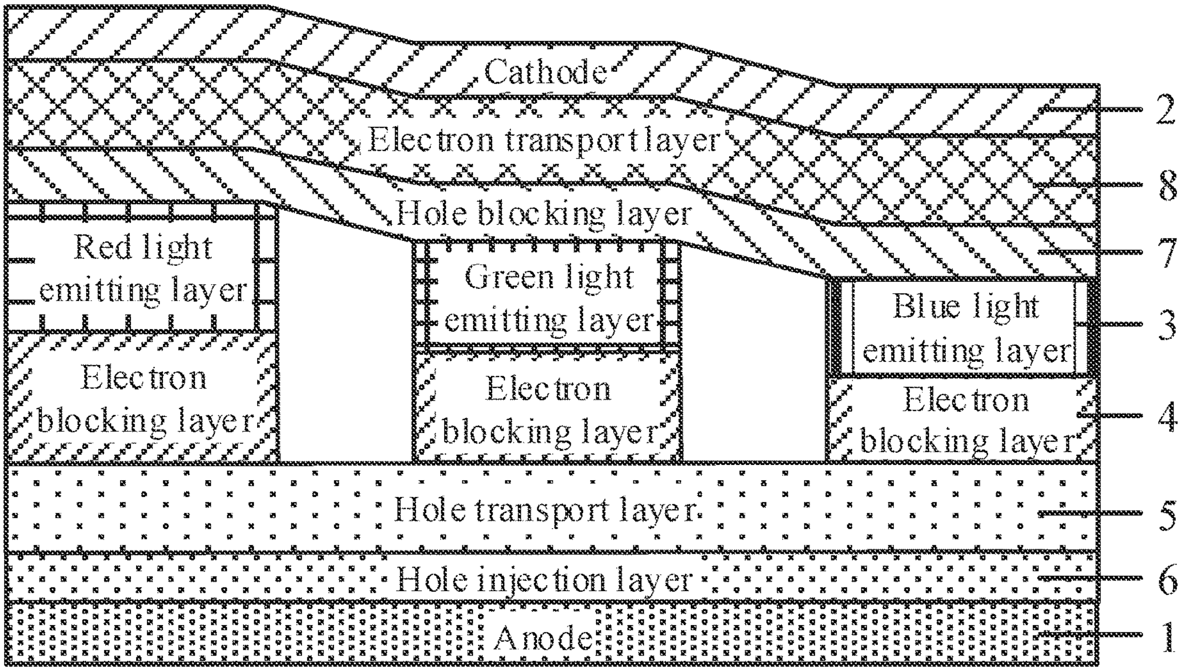
FIG. 7 is a schematic structural diagram of a display panel according to an embodiment of the disclosure.

Optionally, in the above display panel according to embodiments of the disclosure, as shown in FIG. 7, the electron injection layer is not shown in FIG. 7, and the sub-pixel units include: a red sub-pixel unit R, a green sub-pixel unit G and a blue sub-pixel unit B.

The red sub-pixel unit R and the green sub-pixel unit G include the above organic electroluminescent device, and the blue sub-pixel unit B includes a blue organic electroluminescent device.

A light emitting layer of the blue organic electroluminescent device includes: an electron-type host material (BH) and a blue light guest material (BD).

A thickness of an electron blocking layer of the red sub-pixel unit R, a thickness of an electron blocking layer of the green sub-pixel unit G, and a thickness of an electron blocking layer of the blue sub-pixel unit B decrease in sequence; and the electron blocking layer of the red sub-pixel unit R is set to be thicker than the electron blocking layers corresponding to the sub-pixel units in other colors, to facilitate enhancing the microcavity effect and improving the luminous efficiency.

The hole injection layers 6 of all the sub-pixel units are a same film layer, the hole transport layers 5 of all the sub-pixel units are a same film layer, the hole blocking layers 7 of all the sub-pixel units are a same film layer, the electron transport layers 8 of all the sub-pixel units are a same film layer, and the electron blocking layer 4 and the light emitting layer 3 of each sub-pixel unit are independent of each other.

Based on the same inventive concept, an embodiment of the disclosure further provides a display device, including the above display panel according to embodiments of the disclosure.

The type of the display device may be any one of Organic Light-Emitting Diode (OLED) display device, In-Plane Switching (IPS) display device, Twisted Nematic (TN) display device, Vertical Alignment (VA) display device, electronic paper, QLED (Quantum Dot Light Emitting Diode) display device, micro LED (micro Light Emitting Diode, LED) display device or other display devices, which is not limited in the disclosure.

The display device may be: a mobile phone, a tablet, a television, a display, a laptop, a digital photo frame, a navigator, or any other product or component with display function. All of other indispensable components of the display device should be understood by those ordinary skilled in the art to be included, and will be omitted here and should not be considered as limitations on the disclosure. The principle of the display device to solve the problem is similar to that of the above-mentioned organic electroluminescent device, so implementations of the display device can refer to the implementations of the above-mentioned organic electroluminescent device, and the detailed description thereof will not be repeated.

In the above organic electroluminescent device, display panel and display device according to embodiments of the disclosure, on the one hand, the energy level barrier between the hole transport layer and the electron blocking layer is increased by setting the electron mobility of the hole transport layer to be greater than the electron mobility of the electron blocking layer, thereby avoiding excessive holes from being transported to the electron blocking layer too quickly, solving the problem of accumulation of holes in the electron blocking layer and light emitting layer, and alleviating the situation that the recombination region is close to the side of the electron blocking layer; and on the other hand, the absolute value of the difference between the HOMO value of the hole transport layer and the HOMO value of the electron blocking layer is set to be greater than or equal to 0.08 eV and less than or equal to 0.3 eV, the triplet energy level of the guest material is set to be less than the triplet energy level of the electron blocking layer, and the triplet energy level of the electron blocking layer is set to be greater than 2.4 eV. This energy level relationship not only helps to control the injection rate of holes from the hole transport layer to the electron blocking layer, but also facilitates the transport of holes on the hole-type host material, so that the holes are effectively limited in the light emitting layer and recombined with electrons to form excitons to emit light, and the exciton recombination region moves toward the center of the light emitting layer. The combined effect of the two aspects effectively avoids the accumulation of holes at interfaces of the light emitting layer and the electron blocking layer, and enables the holes to better move into the interior of the light emitting layer, thus improving the efficiency and lifetime of the organic electroluminescent device.

Although embodiments of the disclosure have been described, those skilled in the art can make additional alterations and modifications to these embodiments once they learn about the basic creative concepts. Thus, the attached claims are intended to be interpreted to include embodiments as well as all the alterations and modifications falling within the scope of the disclosure.

Evidently, those skilled in the art can make various modifications and variations to embodiments of the disclosure without departing from the spirit and scope of embodiments of the disclosure. Thus, the disclosure is also intended to encompass these modifications and variations to embodiments of the disclosure as long as these modifications and variations come into the scope of the claims of the disclosure and their equivalents.

What is claimed is:

1. A display panel, comprising: a plurality of sub-pixel units, wherein at least some of the sub-pixel units comprise an organic electroluminescent device, the organic electroluminescent device comprises: an anode and a cathode disposed opposite to each other, a light emitting layer located between the anode and the cathode, an electron blocking layer located between the light emitting layer and the anode, and a hole transport layer located between the electron blocking layer and the anode; wherein:

the light emitting layer comprises: an exciplex formed by mixing an electron-type host material and a hole-type host material, and a guest material doped in the exciplex;

an electron mobility of the hole transport layer is greater than an electron mobility of the electron blocking layer, an absolute value of a difference between an Highest Occupied Molecular Orbital (HOMO) value of the hole transport layer and an HOMO value of the electron blocking layer is greater than or equal to 0.08 eV and less than or equal to 0.3 eV, a triplet energy level of the guest material is less than a triplet energy level of the electron blocking layer, and the triplet energy level of the electron blocking layer is greater than 2.4 eV;

the guest material is an organic metal complex, and the metal comprises iridium or platinum;

the sub-pixel units comprise: a red sub-pixel unit, a green sub-pixel unit and a blue sub-pixel unit; wherein:

the red sub-pixel unit and the green sub-pixel unit comprise the organic electroluminescent device, and the blue sub-pixel unit comprises a blue organic electroluminescent device;

a light emitting layer of the blue organic electroluminescent device comprises an electron-type host material and a blue light guest material;

a thickness of an electron blocking layer of the red sub-pixel unit, a thickness of an electron blocking layer of the green sub-pixel unit, and a thickness of an electron blocking layer of the blue sub-pixel unit decrease in sequence;

hole blocking layers of all the sub-pixel units are a same film layer, and electron transport layers of all the sub-pixel units are a same film layer.

2. The display panel according to claim 1, wherein a ratio of the electron mobility of the hole transport layer to the electron mobility of the electron blocking layer is between 1 and $10^4$.

3. The display panel according to claim 1, wherein the electron mobility of the hole transport layer is $10^{-5}cm^2/(V\cdot s)$ to $10^{-3}cm^2/(V\cdot s)$, and the electron mobility of the electron blocking layer is $10^{-7}$ $cm^2/(V\cdot s)$ to $10^{-5}$ $cm^2/(V\cdot s)$.

4. The display panel according to claim 1, wherein an absolute value of a difference between Lowest Unoccuppied Molecular Orbital (LUMO) value of the electron blocking layer and an LUMO value of the hole-type host material is greater than 0.3 eV.

5. The dis panel according to claim 1, wherein an absolute value of a difference between an HOMO value of the hole-type host material and an HOMO value of the electron-type host material is greater than or equal to 0.25 eV and less than or equal to 0.75 eV.

6. The display panel according to claim 1, wherein a refractive index of the electron blocking layer is greater than a refractive index of the hole transport layer.

7. The display panel according to claim 1, wherein a refractive index of the hole transport layer is 1.7 to 1.8, and a refractive index of the electron blocking layer is 1.8 to 2.0.

8. The display panel according to claim 7, wherein a structural general formula of a material of the electron blocking layer is

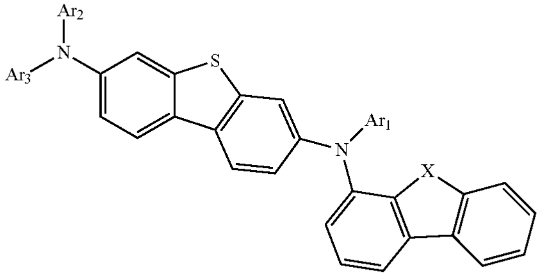
,

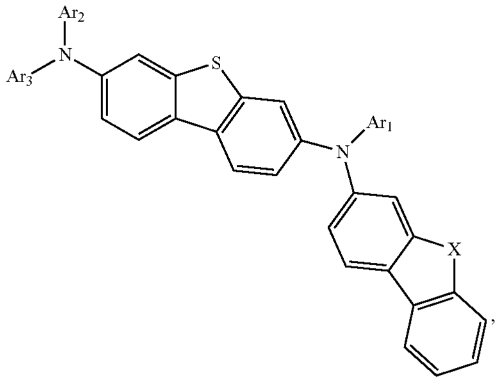
,

-continued

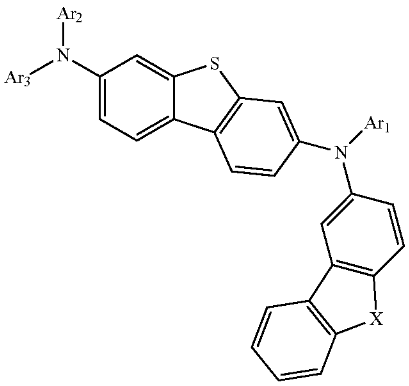

or

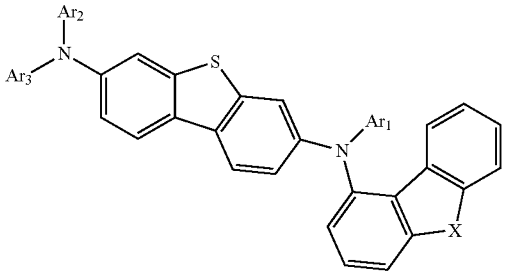

;

wherein $Ar_1$-$Ar_3$ are C1-C5 alkyl substituted or unsubstituted C6-C30 aryl or heteroaryl group, C3-C10 cycloalkyl substituted or unsubstituted C6-C30 aryl or heteroaryl group; X is O, S, C, Si or N—R; and R is alkyl or cycloalkyl substituted or unsubstituted phenylene, biphenyl or terphenyl.

9. The display panel according to claim 8, wherein the material of the electron blocking layer is

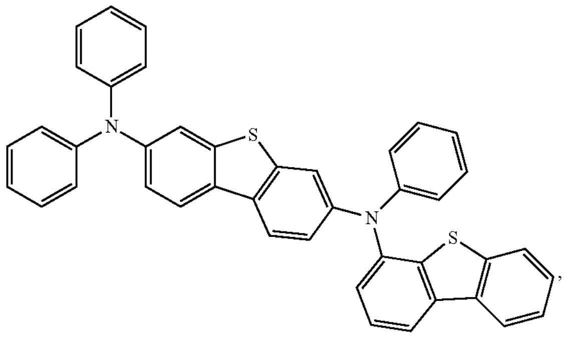

,

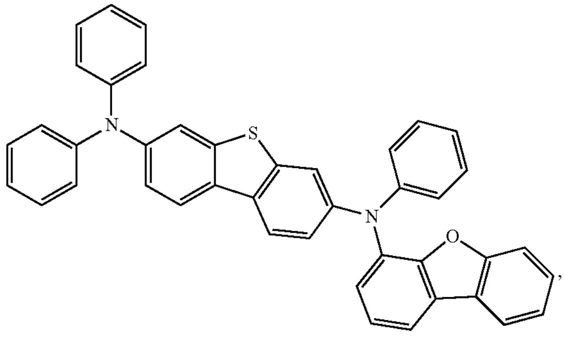

,

-continued

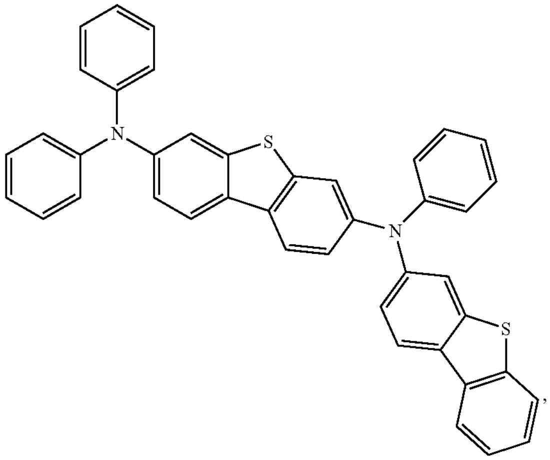

,

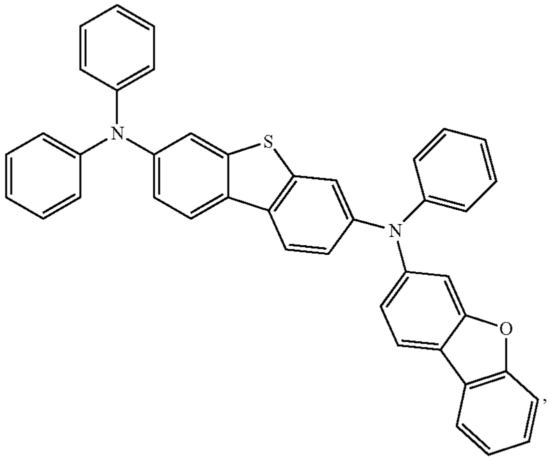

,

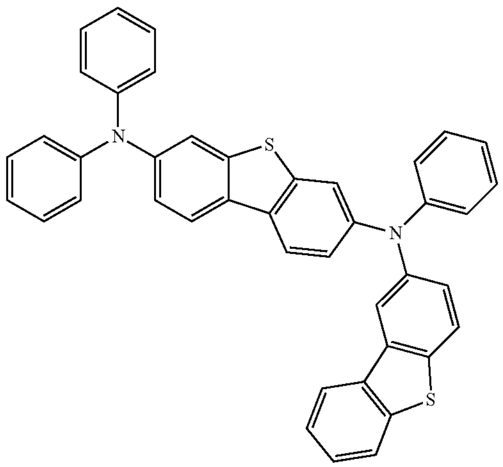

,

-continued

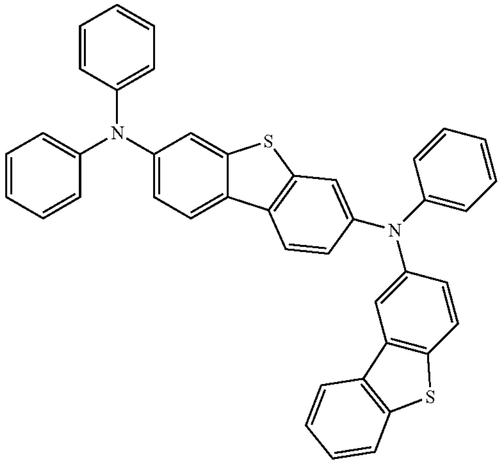

,

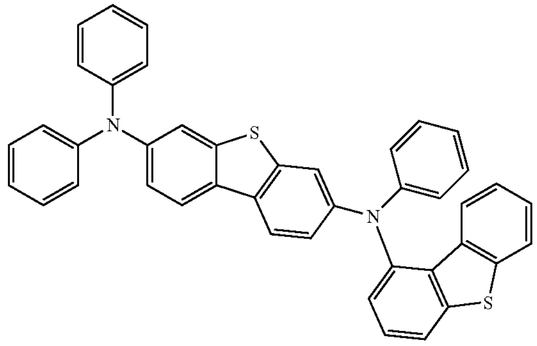

or

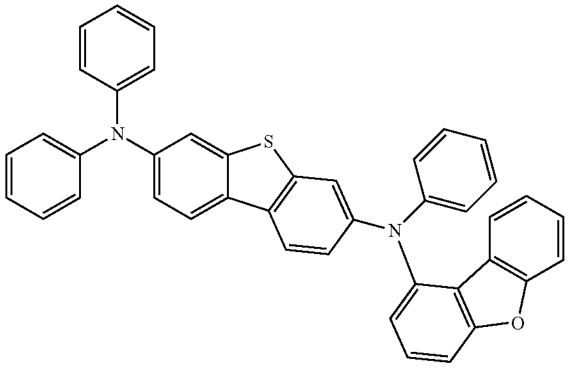

.

10. The display panel according to claim 1, wherein a structural general formula of the hole-type host material is

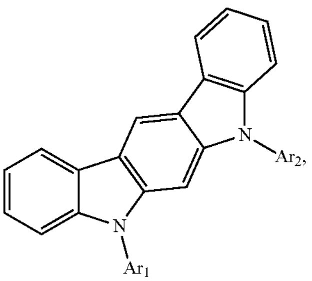

-continued

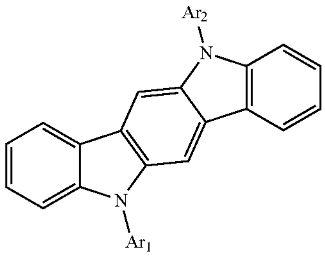

or

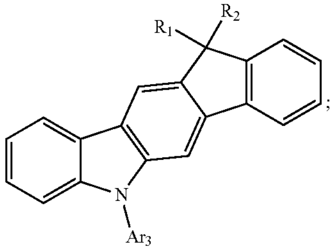

;

wherein $R_1$ and $R_2$ are alkyl and aryl groups; and $Ar_1$-$Ar_3$ are substituted or unsubstituted aryl or heteroaryl groups.

11. The display panel according to claim 1, wherein a structural general formula of the electron-type host material is

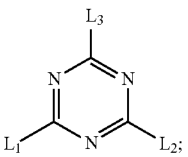

wherein $L_1$-$L_3$ are substituted or unsubstituted aryl or heteroaryl groups.

12. The display panel according to claim 1, wherein an energy level difference between a triplet energy level of the exciplex and a singlet energy level of the exciplex is less than or equal to 0.1 eV.

13. The display panel according to claim 1, wherein an emission spectrum peak of the hole-type host material is less than an emission spectrum peak of the electron-type host material;

an emission spectrum peak of the exciplex is greater than or equal to 500 nm and less than or equal to 580 nm.

14. The display panel according to claim 1, wherein a thickness of the light emitting layer is 20 nm to 70 nm, and a doping proportion of the guest material in the light emitting layer is 2% to 10%.

15. The display panel according to claim 1, further comprising: a hole injection layer located between the anode and the hole transport layer, a hole blocking layer located between the light emitting layer and the cathode, an electron transport layer located between the hole blocking layer and the cathode, and an electron injection layer located between the electron transport layer and the cathode;

wherein a thickness of the hole injection layer is 5 nm to 20 nm, a thickness of the hole transport layer is 80 nm to 150 nm, a thickness of the hole blocking layer is 5 nm to 20 nm, a thickness of the electron transport layer is 20 nm to 50 nm, and a thickness of the electron injection layer is 1 nm to 10 nm.

16. The display panelorganic electroluminescent device according to claim 1, wherein the light emitting layer is a red light emitting layer or a green light emitting layer.

17. A display device, comprising the display panel according to claim 1.

* * * * *